(12) United States Patent
Wang et al.

(10) Patent No.: US 7,544,606 B2
(45) Date of Patent: Jun. 9, 2009

(54) METHOD TO IMPLEMENT STRESS FREE POLISHING

(75) Inventors: Jean Wang, Hsin Chu (TW); Chia-Ming Yang, Hsin-Chu (TW); Henry Lo, Hsinchu (TW); Joshua Tseng, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 311 days.

(21) Appl. No.: 11/142,215

(22) Filed: Jun. 1, 2005

(65) Prior Publication Data

US 2006/0276030 A1 Dec. 7, 2006

(51) Int. Cl.
    *H01L 21/4763* (2006.01)
(52) U.S. Cl. .................. 438/631; 438/633; 438/687; 438/691; 438/692; 257/E21.495
(58) Field of Classification Search .......... 438/631, 438/633, 691–692, 687
    See application file for complete search history.

(56) References Cited

U.S. PATENT DOCUMENTS

| 5,186,718 | A | * | 2/1993 | Tepman et al. | ........... 29/25.01 |
| 7,273,808 | B1 | * | 9/2007 | Lin | ............................. 438/622 |
| 7,375,024 | B2 | * | 5/2008 | Park | ............................. 438/627 |
| 2003/0089928 | A1 | * | 5/2003 | Saito et al. | ................... 257/213 |
| 2004/0012090 | A1 | * | 1/2004 | Basol et al. | ................. 257/755 |
| 2004/0014312 | A1 | * | 1/2004 | Kunishima et al. | ......... 438/637 |
| 2005/0042873 | A1 | * | 2/2005 | Uzoh et al. | ................. 438/689 |

OTHER PUBLICATIONS

Murakami, H., et al., "Spin-on Cu Films for Ultralarge Scale Integrated Metallization," J. Vac. Sci. Technol. B 17(5), Sep./Oct. 1999, pp. 2321-2324.
Pallinti, J., et al., "An Overview of Stress Free Polishing of Cu with Ultra Low-k (k<2.0) Films," Interconnect Technology Conference, 2003 International Proceedings of the IEEE, 3 pages.

* cited by examiner

*Primary Examiner*—Thanh Nguyen
(74) *Attorney, Agent, or Firm*—Slater & Matsil, L.L.P.

(57) ABSTRACT

A method of forming a metal feature in a low-k dielectric layer is provided. The method includes forming an opening in a low-k dielectric layer, forming a metal layer having a substantially planar surface over the low-k dielectric layer using spin-on method, and stress free polishing the metal layer. Preferably, the metal layer comprises copper or copper alloys. The metal layer preferably includes a first sub layer having a substantially non-planar surface and a second sub layer having a substantially planar surface on the first sub layer.

19 Claims, 5 Drawing Sheets

METHOD TO IMPLEMENT STRESS FREE POLISHING

TECHNICAL FIELD

This invention relates generally to semiconductor processes, and specifically to damascene processes that include stress free polishing.

BACKGROUND

As the semiconductor industry introduces new generations of integrated circuits (IC's) having higher performance and greater functionality, the density of the elements that form the integrated circuits is increased, and the dimensions, sizes and spacing between the individual components or elements are reduced. While in the past such reductions were limited only by the ability to define the structures photo-lithographically, device geometries having even smaller dimensions created new limiting factors. For example, for any two adjacent conductive paths, as the distance between conductors decreases, the resulting capacitance (a function of the dielectric constant (k) of the insulating material divided by the distance between conductive paths) increases. This increased capacitance results in increased capacitive coupling between the conductors, increased power consumption, and an increase in the resistive-capacitive (RC) time constant. Therefore, the continual improvement in semiconductor IC performance and functionality is dependent upon developing materials that form a dielectric film with a lower dielectric constant (k value) than that of the most commonly used material, silicon oxide, thus resulting in reduced capacitance. As the dimensions of these devices get smaller and smaller, significant reductions in capacitance into the so-called "ultra low k" regime is required.

New materials with low dielectric constants (known in the art as "low-k dielectrics") are being investigated for their use as insulators in semiconductor chip designs. A low dielectric constant material aids in enabling further reduction in the integrated circuit feature dimensions. The substance with the lowest dielectric constant is air (k=1.0). Therefore, porous dielectrics are very promising candidates since they have the potential to provide very low dielectric constants.

However, porous dielectrics are mechanically weak by nature. Weak dielectrics would fail in the chemical mechanical polish (CMP) process employed to planarize the wafer surface during chip manufacturing. The mechanical properties of a porous dielectric are functions of the porosity of the dielectric. Naturally, higher porosity results in lower dielectric constant but also poorer mechanical properties. As a result, delamination may occur between the porous low-k dielectric and a superjacent or subjacent metal when a chemical mechanical polish is performed, due to the mechanical stress applied by the CMP. When integrated circuits become smaller, materials with lower k, hence lower mechanical strength, are expected to be used, resulting in more severe problems.

To overcome the problems caused by weak mechanical properties of low-k dielectrics, stress free polishing (SFP) is gradually replacing CMP, especially in damascene processes that involve copper and low-k dielectrics. SFP can be completely stress free, thus it is suitable for working with dielectrics having very low mechanical strength.

SFP suffers drawbacks, however. SFP does not have good planarization ability, thus very complex dummy patterns are typically required in order to form planar surfaces. FIGS. 1 and 2 illustrate a conventional damascene process, wherein electro-chemical plating is combined with stress free polishing. FIG. 1 illustrates openings $100_1$ and $100_2$ formed in a low-k dielectric layer 102. Openings $100_1$ are closely spaced and have small dimensions. Opening $100_2$ has a relatively greater (wider) dimension. A copper or a copper alloy is filled into the openings $100_1$ and $100_2$ by electro-chemical plating, forming a copper layer 103. As a result of the patterned surface of the dielectric layer 102, a hump 104 is formed over the dense and narrow openings $100_1$, and a recess 106 is formed over the opening $100_2$.

An (stress free) electro-polishing is then performed to remove excessive copper, as shown in FIG. 2. The resulting structure has a topographic surface. While copper 108 in the opening $100_2$ is typically recessed, a hump 110 may be formed over the openings $100_1$ and interconnects the metal features in openings $100_1$, causing integrated circuit failure. This potential problem significantly limits the usage of stress free polishing in the manufacture of integrated circuits. Therefore, a method that maximizes the benefit of stress free polishing without causing a non-planar surface is needed.

SUMMARY OF THE INVENTION

In accordance with one aspect of the present invention, a method of forming a semiconductor structure includes forming an opening in a low-k dielectric layer, forming a metal layer over the low-k dielectric layer and filling the opening by using a planar-surface forming method. The metal layer has a substantially planar surface and preferably includes a first sub layer having a substantially non-planar surface and a second sub layer having a substantially planar surface on the first sub layer. The method further includes stress free polishing the metal layer.

In accordance with another aspect of the present invention, a method of forming a metal feature in a low-k dielectric layer includes forming an opening in a low-k dielectric layer, forming a barrier layer and a seed layer in the opening, and forming a first copper layer in the opening, preferably using electro-chemical plating (ECP). A second copper layer is preferably formed using a spin-on technique so that the second copper layer has a substantially planar surface. The method further includes performing a stress free polishing (SFP) to remove excessive copper above the low-k dielectric layer. Preferably, the first copper layer is substantially higher than the top surface of the low-k dielectric layer, thus after SFP, the spin-on copper is removed entirely.

In accordance with another aspect of the present invention, a method of forming a metal feature in a low-k dielectric layer includes forming an opening in a low-k dielectric layer, forming a barrier layer in the opening, and forming a copper layer. Preferably, the copper layer is formed by using spin-on or other methods that can form planar surfaces. A stress free polishing (SFP) is performed to planarize the copper layer to the top surface of the low-k dielectric layer.

In accordance with another aspect of the present invention, materials such as copper, aluminum, tungsten, silver, gold, carbon nano-tube, and their combinations can be used to form a metal layer/layers for filling the opening. Stress free polishing can be combined with additional processes such as electro-chemical mechanical polishing, dummy pattern, etching back, selective SFP, etc. to further planarize the surface of the metal layer/layers.

In accordance with yet another aspect of the present invention, the steps of forming a metal layer/layers and stress free polishing the metal layer/layers are preferably performed in an integrated apparatus so that maximum performance of the resulting semiconductor structure is obtained.

The preferred embodiments of the present invention are advantageously completely or substantially stress free, and thus can be used in damascene processes having very low-k dielectrics. The production cost is also lowered.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In semiconductor integrated circuit manufacturing processes, semiconductor devices are formed in/on a substrate. Metal features, such as metal lines, vias, and contacts, are used to interconnect devices. Metal features may be formed in different layers and separated by inter-layer dielectrics (ILD), also called inter-metal dielectrics (IMD). Damascene processes become common practices in the formation of metal features, particular for forming copper lines and vias. For discussion purposes, copper is referred to as the conductive material in the damascene processes throughout the description. However, other commonly used conductive materials such as copper alloy, aluminum, tungsten, silver, gold, carbon nano-tube (CNT), and their combinations can also be used.

Figure 1:
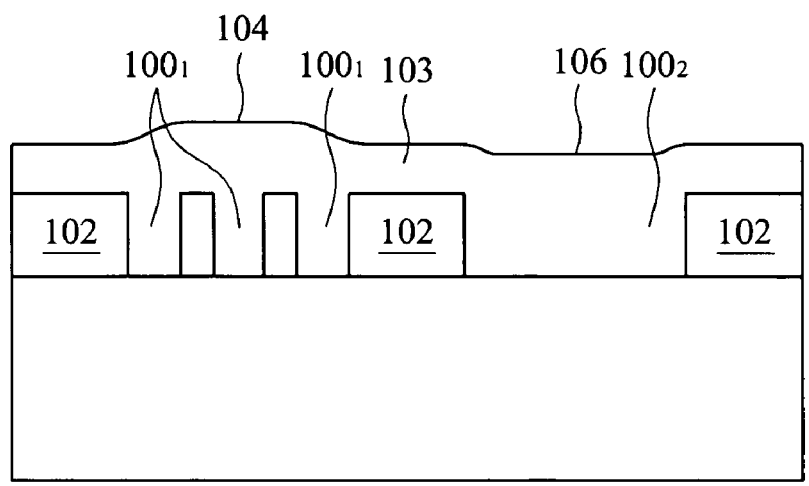
FIGS. 1 and 2 illustrate cross-sectional views of a conventional damascene process using electro-chemical plating and stress free polishing.
Figure 2:
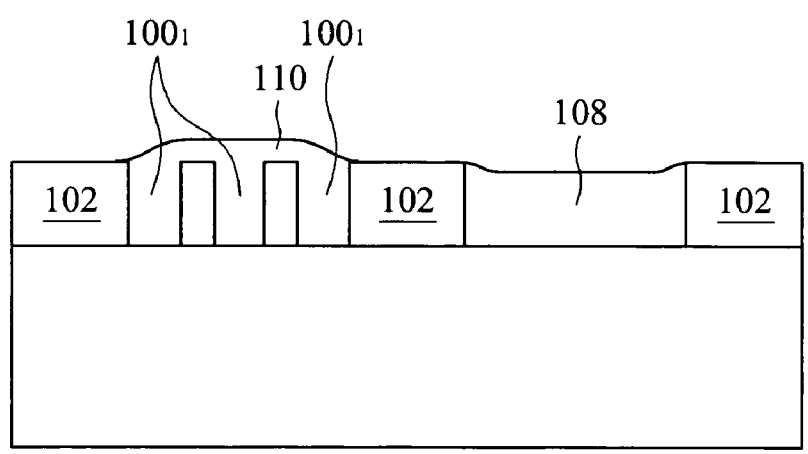
Figure 3:
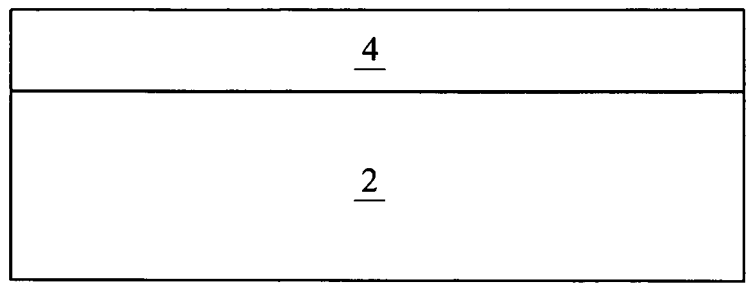
FIGS. 3 through 9 are cross-sectional views of intermediate stages in a preferred single damascene process.

FIGS. 3 through 9 illustrate a preferred embodiment of the present invention. FIG. 3 illustrates a dielectric layer 4 on a base layer 2. The base layer 2 may be a substrate that typically has devices (not shown) formed in/on it. The subsequently formed metal features, which may be metal lines, vias or contact plugs, are preferably coupled to the devices. The base layer 2 may also be a dielectric layer. In the preferred embodiment, dielectric layer 4 has a dielectric constant (k value) of less than about 4, more preferably less than about 3. Dielectric layer 4 preferably comprises materials such as Black Diamond by Applied Materials, CORAL by Novellus, Aurora by ASM America, SiLK by Dow Chemical Company, LKD by Japanese Synthetic Rubber Co., and other common Si, O, C, H, F containing materials, and is preferably formed by spin-on, chemical vapor deposition (CVD), plasma enhanced CVD (PECVD), atomic layer deposition (ALD), sub-atmospheric CVD (SACVD), low pressure CVD (LPCVD), or other known deposition techniques.

Figure 4:
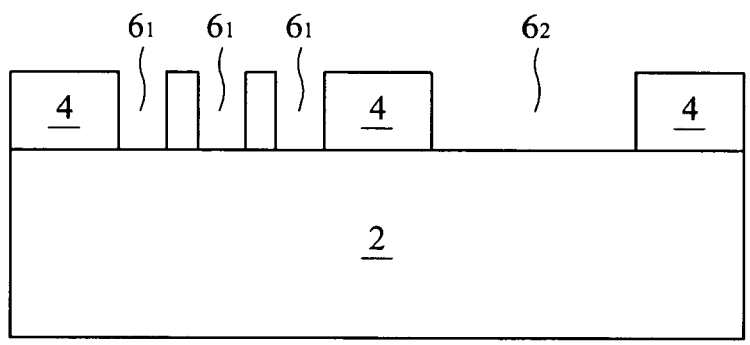

FIG. 4 illustrates openings 6 formed in the dielectric layer 4. For illustration purposes, the openings 6 include a set of narrow and closely spaced openings $6_1$ and a wide opening $6_2$. Each of the openings 6 may be a via opening, a trench opening, a contact opening and the like.

Figure 5:
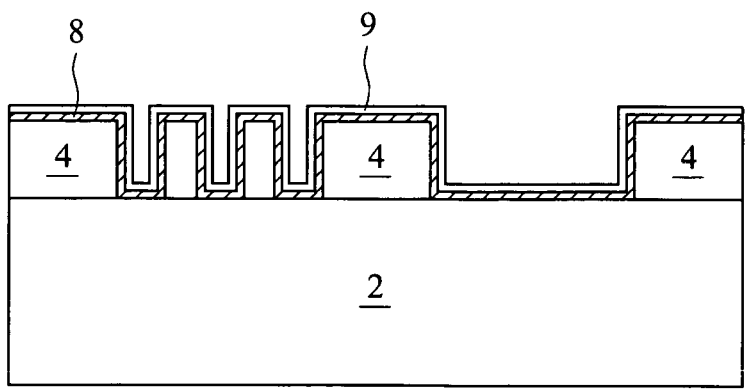

FIG. 5 illustrates the formation of a barrier layer 8 and a seed layer 9. Copper has high diffusibility. To prevent diffused copper from degrading the dielectric layer 4, a diffusion barrier layer 8, also referred to as liner 8, is formed in the openings 6. The barrier layer 8 preferably comprises commonly used materials such as tantalum, tantalum nitride, and the like.

A seed layer 9 is formed on the barrier layer 8. The seed layer 9 acts as a cathode for electro-plating a thick copper layer that overfills the openings 6. The seed layer 9 is preferably formed using plasma vapor deposition (PVD) or atomic layer deposition (ALD) and has a thickness of several hundred angstroms, preferably less than about 800 Å.

Figure 6:
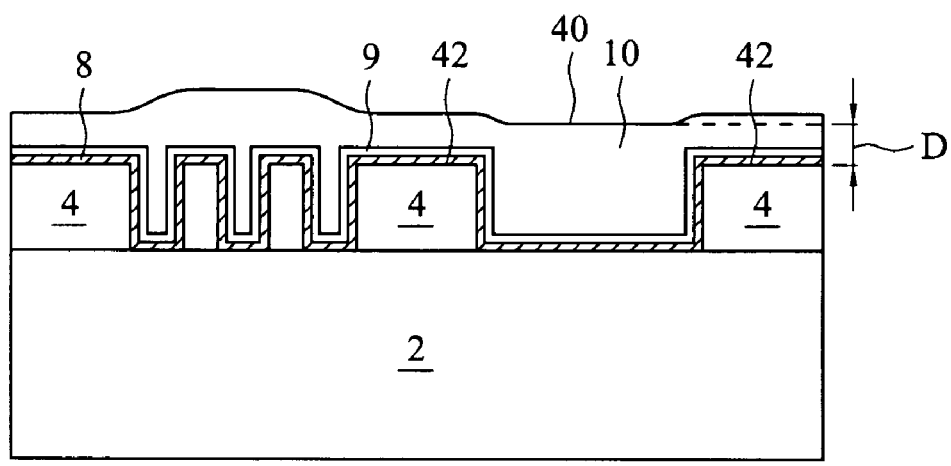

A copper layer 10 is then formed to fill openings 6, as illustrated in FIG. 6. In the preferred embodiment, the copper layer 10, or also referred to as first sub layer 10, can be formed by using electro-chemical plating (ECP), and is sometimes referred to as ECP copper 10. In other embodiments, chemical vapor deposition (CVD), atomic layer deposition (ALD), electro-less plating, physical vapor deposition, supercritical fluid deposition, reflow metal, and the like can be used. Since at least a portion of the copper layer 10 will remain after a subsequent polishing step, methods that can form a high quality copper layer is preferred. Since the dielectric layer 4 has a topographic (or non-planar) surface, the resulting copper layer 10 has a topographic surface with high points and low points. Assuming the lowest point of the copper layer 10 is point 40, which is likely over the wide opening $6_2$, point 40 is preferably higher than the top surface 42 of the dielectric layer 4. More preferably, the height difference D between the point 40 and the top surface 42 is preferably greater than about 10 Å.

Figure 7:
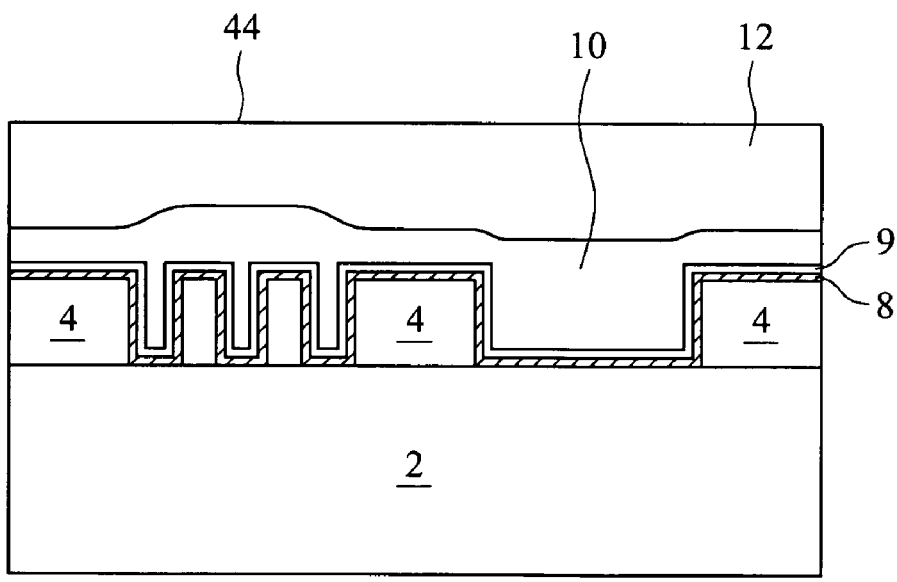

Since the copper layer 10 has a topographic surface, if a stress free polishing is performed, the unevenness of the surface will cause the surface of the resulting structure to be non-planar. Therefore, a second copper layer 12, or sub layer 12 that has a substantially planar surface 44 is preferably formed, as illustrated in FIG. 7. In the preferred embodiment, the copper layer 12 is formed by a spin-on process, hence is referred to as spin-on copper 12. However, other planar-surface forming methods such as electro-chemical mechanical deposition (eCMD) can also be used. One advantageous feature of forming spin-on copper 12 on the ECP copper 10 is that the spin-on copper has excellent adhesion with the ECP copper, while the spin-on copper has poor adhesion with the barrier layer 8 and is likely to delaminate.

Before forming the second copper layer 12, the surface of the copper layer 10 is preferably pretreated to remove native oxide and contamination using chemicals such as $HNO_3$, HF, $H_2SO_4$, and the like, or a plasma treatment, such as an $NH_3$ plasma. To further enhance adhesion, additional pretreatments are preferably performed on the surface of the copper layer 10 before forming the copper layer 12. The preferred pretreatments include plasma $H_2$ treatment, $SCCO_2$ treatment, chemical cleaning using $NH_4F$, thermal gas cleaning using $H_2$, and the like.

In the preferred embodiment, the seed layer 9 and copper layer 10 are formed before the formation of the copper layer 12. In alternative embodiments, the spin-on copper layer 12 is formed directly on the barrier layer 8. The top surface of the substantially planar copper layer 12 is preferably substantially higher than the top surface of the dielectric layer 4. Since the surface of the spin-on copper 12 is substantially planar, an additional copper layer on the spin-on copper layer 12 is typically unnecessary although one can be formed if desired. However, due to the weak adhesion between the spin-on copper and the barrier layer 8, the barrier layer 8 is preferably treated before the spin-on copper layer 12 is formed, and the treatment can be performed using the same method as the pretreatment of the ECP copper 10.

Figure 8:
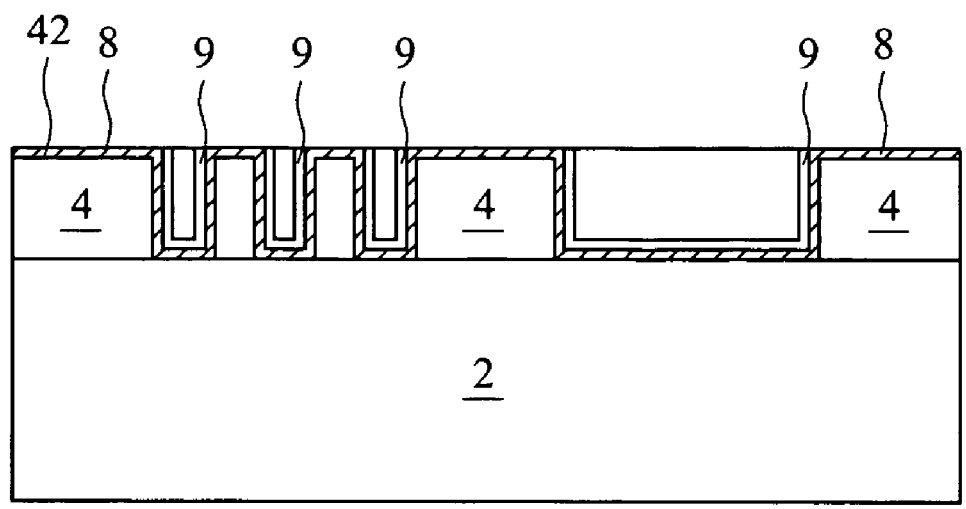

FIG. 8 illustrates the removal of excess copper by using stress free polishing. In the preferred embodiment, the stress free polishing comprises electro-polishing. In other embodiments, plasma etching, wet chemical etching, ion-beam etching, and combinations of these methods can be used. Since the lowest point 40 of the copper layer 10, as referred to in FIG. 6, is higher than the top surface 42 of the dielectric layer 4, the entire spin-on copper layer 12 and a portion of the copper layer 10 is removed, thus exposing the barrier layer 8. Since the surface 44 as referred to in FIG. 7 is substantially planar, the top surface of the structure shown in FIG. 8 is substantially planar.

In an exemplary electro-polishing process, the sample to be electro-polished is immersed in a reaction tube. The etchant solution in the tube includes about 85 percent of $H_3PO_4$, about 5 percent of citric acid, and about 1 percent of PEG. The sample device is connected to a current source with a platinum electrode connected as a cathode. The temperature of the etchant is preferably about 25° C. The electro-polishing is performed with a sample surface current density of about 0.005 $A/cm^2$ for about 1 minute. Under such exemplary conditions, between about 10 nm and about 1000 nm copper can be electro-polished.

The stress free polishing can be combined with additional approaches to further improve the planarization effect. Such additional approaches include CMP, electrochemical mechanical polish (eCMP), dummy pattern, etching back, selective SFP, etc.

Figure 9:
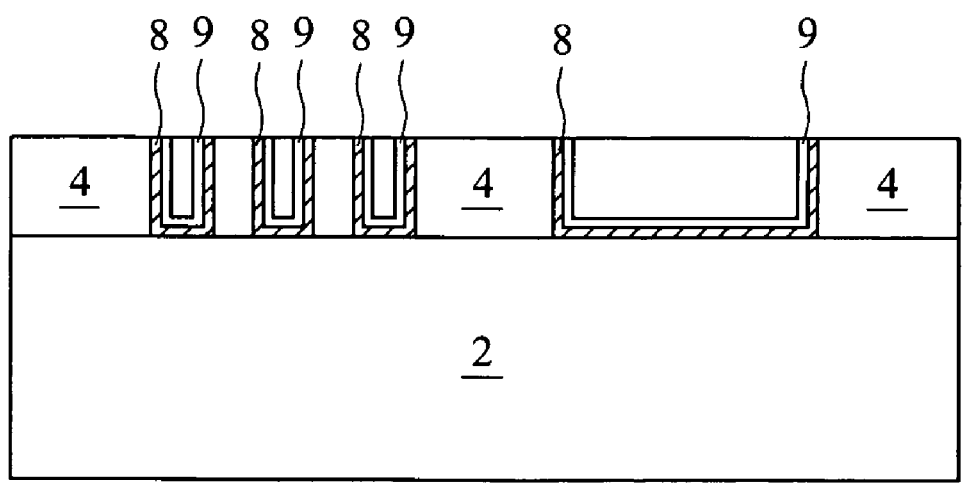

The barrier layer 8 that is on the dielectric layer 4 is then removed, preferably by stress-free plasma dry etching. FIG. 9 illustrates the resulting structure.

Part of the previously discussed wafer processing steps, including forming and stress free polishing copper layers, are preferably performed in an integrated apparatus, wherein sequential wafer processing steps are grouped together and performed inside a single vacuum environment. The single vacuum environment and sequential deposition and polishing avoid exposing the formed structure to external environments (such as air), thus preventing oxidation of copper layers and the barrier layer and moisture penetration. In conventional damascene processes, since spin-on copper subjects more easily to characteristic degrading factors such as oxidation and moisture penetration, Q-time control is typically strict, wherein the Q-time is the time between the formation and polishing of the copper layers. If, however, the forming and stress free polishing are performed in a single vacuum environment, no oxidation and moisture penetration will occur, and thus adhesion between the barrier and seed layers, and between various copper layers is improved. As a result, the sheet resistance, electro migration properties, and stress migration properties of the copper features will also be improved.

Figure 10:
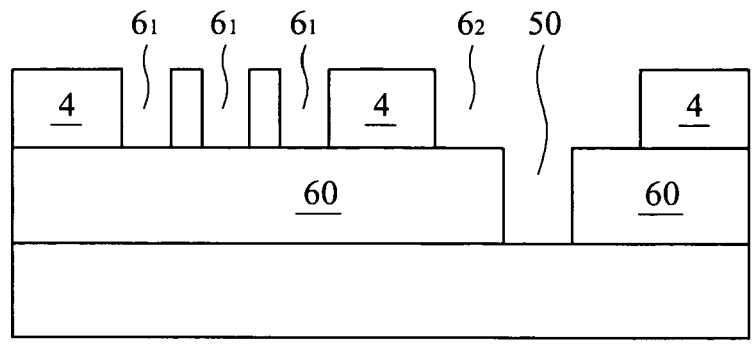
FIGS. 10 through 12 are cross-sectional views of intermediate stages in a preferred dual damascene process.
Figure 11:
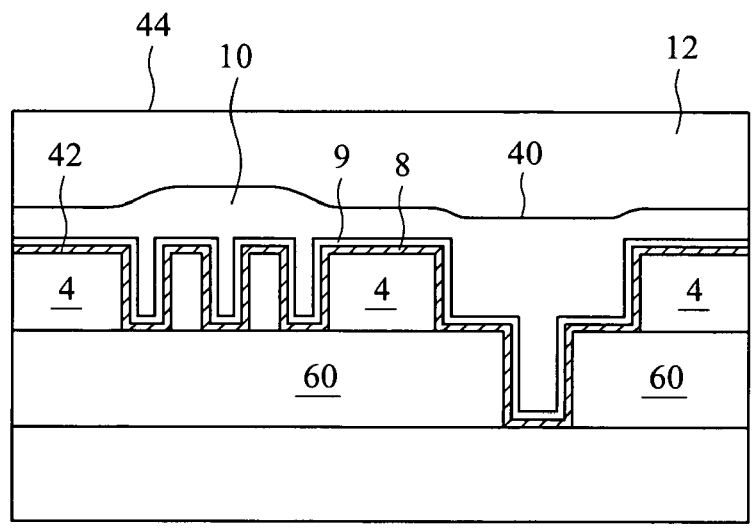
Figure 12:
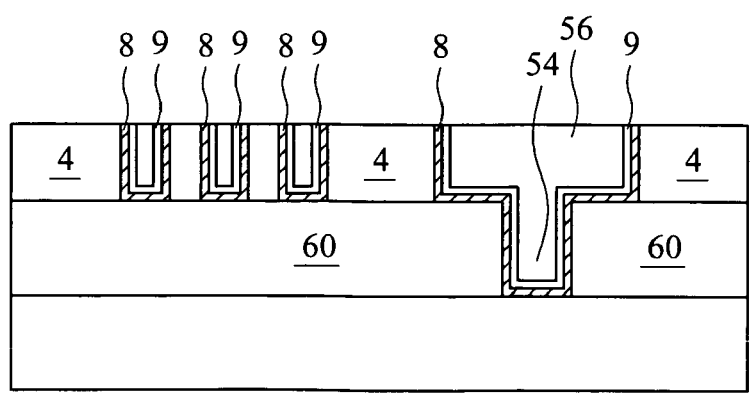

The previously discussed preferred embodiment shows a single damascene process. A preferred embodiment of a dual damascene process is illustrated in FIGS. 10 through 12 and is briefly discussed, wherein like reference numbers are used to designate like elements in the previously illustrated embodiment. Since part of the dual damascene embodiment is substantially similar to the previously described single damascene embodiment, formation details will not be repeated.

In FIG. 10, a dielectric layer 4 is formed on a dielectric layer 60. Both layers 4 and 60 are preferably low-k dielectric layers. Openings $6_1$ and a trench opening $6_2$ are formed in the dielectric layer 4. A via opening 50 is formed in the dielectric layer 60.

As shown in FIG. 11, the via opening 50, openings $6_1$ and the trench opening $6_2$ are deposited with a barrier layer 8 and a seed layer 9, followed by a copper layer 10. The copper layer 10 is preferably formed using ECP or other methods that forms high quality copper layers. The lowest point 40 of the copper layer 10 is preferably higher than the top surface 42 of the dielectric layer 4. A second copper layer 12 with a substantially planar surface is formed on the copper layer 10, preferably using spin-on or other planar-surface forming methods.

FIG. 12 illustrates the removal of the excessive copper and a portion of the barrier layer 8 that is over the dielectric layer 4. A metal line 56 and a via 54 are formed. The resulting structure has a substantially planar surface.

The preferred embodiments of the present invention have several advantageous features. Firstly, stress free polishing introduces no stress, thus the delamination problems, which are common in CMP, will not occur. This advantageous feature is more significant for the manufacture of future generations of the integrated circuits, where dielectrics with lower k values, hence lower mechanical strength, are likely to be used. Secondly, the cost of stress free polishing is significantly lower than that of the CMP. Thirdly, there is no dishing problem, and metal features, which include metal lines and vias, have substantially planar surfaces.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate form the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure comprising:

forming an opening in a low-k dielectric layer;

forming a metal layer over the low-k dielectric layer and filling the opening using a planar-surface forming method, the metal layer having a substantially planar surface, wherein forming the metal layer is preceded by a two-step pretreatment, and wherein a first step of the two-step pretreatment is selected from the group consisting of removing native oxide and contamination using $HNO_3$, removing native oxide and contamination using HF, removing native oxide and contamination using $H_2SO_4$, and removing native oxide and contamination using combinations thereof, and wherein a second step of the two-step pretreatment is selected from the group consisting essentially of a $SCCO_2$ treatment, a chemical cleaning using $NH_4F$, and combinations thereof; and stress free polishing the metal layer, wherein the step of forming the metal layer and the step of stress free polishing the metal layer are performed in a single vacuum environment.

2. The method of claim 1 wherein the planar-surface forming method comprises spin-on.

3. The method of claim 1 wherein the stress free polishing step comprises electro-polishing.

4. The method of claim 1 wherein the stress free polishing step comprises a method selected from the group consisting essentially of electro-polishing, plasma etching, wet chemical etching, ion-beam etching, and combinations thereof.

5. The method of claim 1 wherein the step of forming the metal layer comprises forming a first sub layer with a substantially non-planar surface and forming thereon a second sub layer having a substantially planar surface.

6. The method of claim 5 wherein the forming the second sub layer step is performed by spin-on coating.

7. The method of claim 5 wherein the step of forming the first sub layer is performed by a method selected from the group consisting essentially of electro-chemical plating, electro-chemical mechanical deposition, chemical vapor deposition (CVD), atomic layer deposition (ALD), electro-less plating, physical vapor deposition, supercritical fluid deposition, reflow metal, and combinations thereof.

8. The method of claim 5 further comprising:
forming a seed layer before the step of forming the metal layer; and
forming a barrier layer before the step of forming the first sub layer.

9. The method of claim 5 further comprising the two-step pretreatment after the step of forming the first sub layer and before the step of forming the second sub layer.

10. The method of claim 5 wherein the second sub layer has a top surface having a lowest point substantially higher than a top surface of the low-k dielectric layer.

11. The method of claim 1 wherein the metal layer comprises a material selected from the group consisting essentially of copper, aluminum, tungsten, silver, gold, carbon nano-tube, and combinations thereof.

12. The method of claim 1 wherein the first step of the two-step pretreatment comprises the removing native oxide and contamination using HF.

13. The method of claim 1 wherein the first step of the two-step pretreatment comprises removing native oxide and contamination using $HNO_3$, removing native oxide and contamination using $H_2SO_4$, or removing native oxide and contamination using combinations thereof and the second step of the two-step pretreatment consists of essentially of chemical cleaning using $NH_4F$.

14. A method of forming a metal feature comprising:
providing a low-k dielectric layer;
forming an opening in the low-k dielectric layer;
forming a first copper layer over the low-k dielectric layer, wherein the first copper layer has a substantially non-planar surface, and wherein the substantially non-planar surface has a lowest point substantially higher than a top surface of the low-k dielectric layer;
forming a second copper layer over the first copper layer using a spin-on process, the second copper layer having a substantially planar surface, wherein forming the second copper layer is preceded by a two-step pretreatment, and wherein a first step of the two-step pretreatment is selected from the group consisting of removing native oxide and contamination using $HNO_3$, removing native oxide and contamination using HF, removing native oxide and contamination using $H_2SO_4$, and removing native oxide and contamination using combinations thereof, and wherein a second step of the two-step pretreatment is selected from the group consisting essentially of a $SCCO_2$ treatment, a chemical cleaning using $NH_4F$, and combinations thereof; and
stress free polishing the first and second copper layers to a level substantially equal to the top surface of the low-k dielectric layer;
wherein the steps of forming the first copper layer, forming the second copper layer, and stress free polishing the first and second copper layers are performed in a single vacuum environment.

15. The method of claim 14 wherein the forming the first copper layer step comprises electro-chemical plating.

16. The method of claim 14 wherein the step of stress free polishing the first and second copper layers comprises electro-polishing.

17. The method of claim 14 further comprising:
forming a barrier layer in the opening; and
forming a seed layer over the barrier layer before the step of forming the first copper layer.

18. The method of claim 14 wherein the first step of the two-step pretreatment comprises removing native oxide and contamination using HF.

19. The method of claim 14 wherein the first step of the two-step pretreatment comprises removing native oxide and contamination using $HNO_3$, removing native oxide and contamination using $H_2SO_4$, or removing native oxide and contamination using combinations thereof, and the second step of the two-step pretreatment consists of essentially of chemical cleaning using $NH_4F$.

* * * * *